United States Patent [19]

Yukimoto

[11] Patent Number: 4,737,196

[45] Date of Patent: Apr. 12, 1988

[54] AMORPHOUS SOLAR CELL

[75] Inventor: Yoshinori Yukimoto, Itami, Japan

[73] Assignee: Mitsubishi Denki Kabushiki Kaisha, Tokyo, Japan

[21] Appl. No.: 852,754

[22] Filed: Apr. 16, 1986

[51] Int. Cl.$^4$ ............................................. H01L 31/06
[52] U.S. Cl. .................................... 136/249; 136/258; 357/30
[58] Field of Search ................. 136/249 TJ, 258 AM, 136/258 PC; 357/30 J, 30 K

[56] References Cited

U.S. PATENT DOCUMENTS

| 4,272,641 | 6/1981 | Hanak | 136/249 |
| 4,498,092 | 2/1985 | Yamazaki | 357/2 |
| 4,536,607 | 8/1985 | Weismann | 136/249 |

FOREIGN PATENT DOCUMENTS

| 0042467 | 12/1981 | European Pat. Off. | |
| 55-141765 | 5/1980 | Japan | 136/249 |
| 57-71188 | 5/1982 | Japan. | |
| 57-204178 | 12/1982 | Japan. | |
| 58-122783 | 7/1983 | Japan | 136/249 TJ |
| 59-63774 | 4/1984 | Japan. | |
| 2083701 | 3/1982 | United Kingdom. | |

OTHER PUBLICATIONS

P. H. Fang et al., *Appl. Phys. Lett.,* vol. 41, pp. 365–366 (1982).

Y. Hamakawa et al., "A New Type of Amorphous Silicon Photovoltaic Cell Generating More Than 2.0 V", *Applied Physics Letters,* vol. 35, pp. 187 to 189, 1979.

*Primary Examiner*—Aaron Weisstuch
*Attorney, Agent, or Firm*—Birch, Stewart, Kolasch & Birch

[57] ABSTRACT

An amorphous solar cell having a p-i-n (or n-i-p) structure, in which either or both of the p and n layers are of a double layer structure, including an amorphous semiconductor layer and a micro-crystalline semiconductor layer, wherein both layers are of the same conductivity type and the amorphous semiconductor layer is located at the side of the i layer.

8 Claims, 3 Drawing Sheets

AMORPHOUS SOLAR CELL

FIELD OF THE INVENTION

The present invention relates to an amorphous solar cell which is a possible candidate for a low cost solar cell, and especially to a cell structure appropriate for enhancement of the efficiency thereof.

BACKGROUND OF THE INVENTION

FIG. 3 is a cross-sectional view showing a prior art amorphous solar cell. In FIG. 3, reference numeral 1 designates a substrate, numeral 2 designates as n type semiconductor layer provided over the substrate 1. Numeral 3 designates an i type semiconductor layer, numeral 4 designates a p type semiconductor layer, numeral 5 designates a transparent electrode, and numeral 6 designates a grid electrode. A semiconductor layer in an amorphous state or a micro-crystalline semiconductor layer is used for the n and p type semiconductor layers 2 and 4. A p or n type amorphous semiconductor including impurities has a high resistivity and a small energy band gap, and light absorption is likely to occur therein, thereby causing a loss in efficiency. Accordingly, micro-crystalline semiconductors have recently been used instead of amorphous semiconductors.

The device operates as follows.

When light is incident the surface of the transparent electrode 5, pairs of electrons and positive holes are generated in the i type amorphous semiconductor which electrons and positive holes are pulled towards the n and p type semiconductor layers 2 and 4, respectively, by an internal electric field due to the p and n type semiconductor layers 2 and 4. As a result, a larger number of electrons or positive holes than those arising from thermal equilibrium exist in the n and p type semiconductor layers 2 and 4, respectively. These extra electrons or positive holes flow into a load connected to the solar cell through an external circuit to thereby generate electric power.

In a solar cell using such an amorphous semiconductor, only the i type semiconductor layer 3 is considered to be a main generating region because electrons and positive holes generated in the p and n layer disappear quite rapidly due to recombination.

In order to overcome the disadvantages in such a prior art amorphous solar cell, it has been attempted to replace the amorphous semiconductor by a micro-crystalline semiconductor for the n and p type semiconductor layers 2 and 4, aiming at lowering the resistivity and increasing the energy band gap. In this case, however, recombination centers are produced at the boundary of the micro-crystalline layer and the amorphous layer, and the positive holes or electrons recombine with each other while the extra electrons and positive holes produced in the i layer are moving towards the n and p layers 2 and 4, respectively. This causes the problem that the photocurrent is reduced by the loss of the extra electrons and positive holes.

Another prior art amorphous solar cell is disclosed in an article by Y. Hamakawa, H. Okamoto and Y. Nitta, entitled "A new type of amorphous silicon photovoltaic cell generating more than 2.0 V", *Applied Physics Letters*, Vol. 35, pp 187 to 189 (1979). In this article a device is disclosed which is obtained by laminating a plurality of pin cells and effecting electrical connections between the adjacent cells by p/n junctions. In this device the p and n layers comprise amorphous silicon and recombination occurs in these amorphous layers.

Another prior art amorphous solar cell is disclosed in Japanese Laid-open Patent Publication No. Sho. 55-141765. In this solar cell, the electrical connecting layer between adjacent pin cells comprises a Pt cermet layer.

SUMMARY OF THE INVENTION

It is an object of the present invention to provide an amorphous solar cell having a cell structure capable of reducing the number of recombination centers at the p-i and n-i surfaces, the resistivity along the path of electrons and positive holes and the light absorption loss.

Other objects and advantages of the present invention will become apparent from the detailed description given hereinafter; it should be understood, however that the detailed description and specific embodiment are given by way of illustration only, since various changes and modifications within the spirit and scope of the invention will become apparent to those skilled in the art from this detailed description.

According to the present invention, there is provided an amorphous solar cell having a p-i-n (or n-i-p) structure, in which either of the p or n layer is of a double layer structure comprising an amorphous semiconductor layer and a micro-crystalline semiconductor layer, wherein both layers are of the same conductivity types and the amorphous semiconductor layer is located at the side of the i layer.

DETAILED DESCRIPTION OF THE PREFERRED EMBODIMENTS

Figure 1:
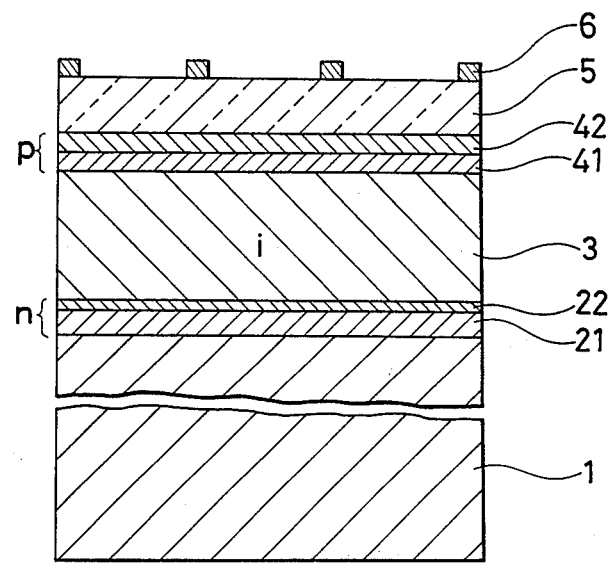
FIG. 1 is a cross-sectional view showing an amorphous solar cell of one embodiment of the present invention.

In ordr to explain the present invention in detail, reference will be particularly made to FIG. 1.

Figure 3:
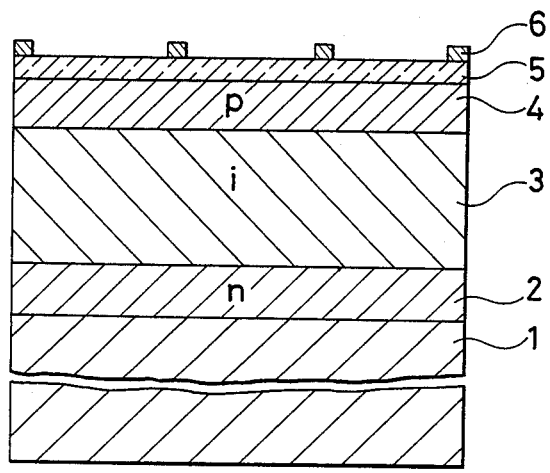
FIG. 3 is a cross-sectional view showing a prior art amorphous solar cell.

In FIG. 1, the same reference numerals are used to designate the same elements as those shown in FIG. 3. Reference numerals 21 and 22 designate an n type micro-crystalline semiconductor layer and an n type amorphous semiconductor layer, respectively, and both layers 21 and 22 together constitute an n layer. The n type micro-crystalline semiconductor layer 21 includes 0.1 to 1 mol % of phosphorous atoms, and has a thickness in the range of 100 to 500 Å. The n type amorphous semiconductor layer 22 similarly includes 0.1 to 1 mol % phosphorous atoms, and is produced to have a thickness in a range of 10 to 50 Å. The numerals 41 and 42 designate a p type amorphous semiconductor layer and a p type micro-crystalline semiconductor layer, respectively, and both layers 41 and 42 together constitute a p layer. The p type amorphous semiconductor layer 41 includes 0.1 to 1 mol % boron atoms, and has a thickness in the range of 10 to 50 Å, and the p type micro-crystalline semiconductor layer 42 includes 0.1 to 1 mol % boron atoms, and has a thickness in the range of 20 to 100 Å.

The function of the double layer structure comprising the amorphous layer and the micro-crystalline layer will be described below.

Although there is a little difference in the function between the n and p types, it is ignored in the following description because it has only a slight influence on the effect of the present invention.

An amorphous semiconductor layer having a thickness in the range of 2 to 3 inter-atomic distances has an internal structure quite similar to that inside a mono-crystalline layer. On the other hand, in an amorphous semiconductor having a thickness exceeding that range both the inter-atomic distance and the bond angle become irregular.

On the contrary, a micro-crystalline layer having a thickness in a range of several tens to several hundreds of Å has a structure quite similar to that of the mono-crystalline layer, and there is a region where the crystallinity is fairly irregular at the boundary between the crystal domains. In such a boundary region non-paired atoms are passivated by hydrogen atoms. When the amorphous layer and the micro-crystalline layer are in contact with each other, it is expected that the boundary region is not perfectly passivated by hydrogen atoms thereby causing a defect. In fact the junction characteristic is not particularly good. Defects are also caused by the amorphous film being irregular due to large scale variation of the growth conditions such as an increase of the high frequency power applied during growth of the micro-crystalline layer after growth of the amorphous layer.

When these defects exist in the p-i or n-i junction boundary surface as in the prior art device, these defects function as recombination centers which prevent the positive holes or electrons from flowing into the i layer, thereby reducing the photocurrent. In this embodiment, however, the p-i and n-i junctions are constituted by two amorphous semiconductors, and the junction comprising the amorphous semiconductor and the micro-crystalline semiconductor constitutes a p-p or n-n junction. In such a construction, the influence of the boundary defect at the boundary between the amorphous layer and the micro-crystalline layer can be ignored because a large number of recombination centers originally exist at the p-p or n-n junction boundary surface. Furthermore, the use of the low resistivity and high energy band gap micro-crystalline film effectively reduces the light absorption loss, and good electrical characteristics are also obtained.

As described above, each of the p and n layers of the amorphous solar cell is provided as a double layer structure comprising an amorphous semiconductor layer and a micro-crystalline semiconductor layer, and the p-i and n-i junctions are constituted only by amorphous semiconductors, thereby resulting in p-i and n-i junctions having a quite small amount of recombination centers. Furthermore, the p and n amorphous layers 22 and 41 are made thin, that is, having a thickness of 10 to 50 Å, whereby the photocurrent loss is reduced to a great extent. The device has a sufficiently low resisitivity due to the use of micro-crystalline n and p layers. This enables the Fermi-levels to be positioned in the neighborhood of the conduction band and the valence band, thereby resulting in a high output solar cell having a high open circuit voltage which corresponds to the difference in the Fermi-levels at the p-i and the n-i junction.

In the illustrated embodiment and p and n layer are constituted by an amorphous layer and a micro-crystalline layer, but the n layer at the substrate side can be constituted by only an amorphous layer.

Figure 2:
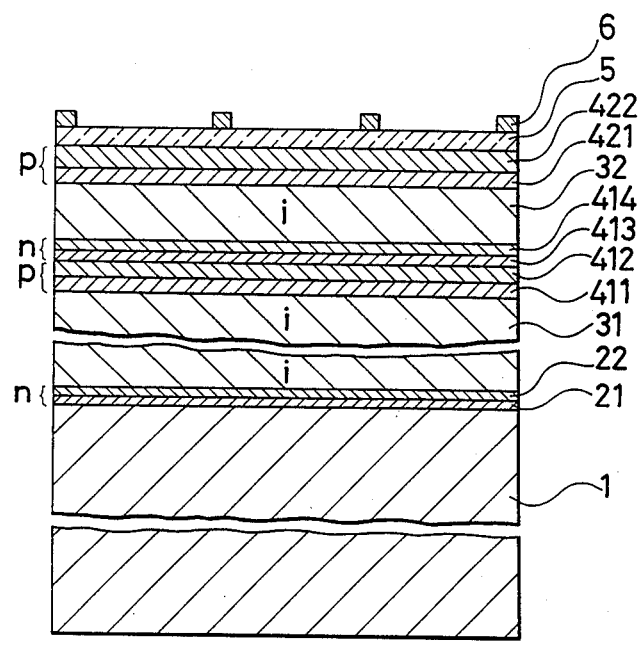
FIG. 2 is a cross-sectional view showing a tandem structure amorphous solar cell of another embodiment of the present invention.

FIG. 2 shows another embodiment of the present invention employing an amorphous solar cell having a tandem structure (pin/pin/pin . . . or nip/nip/ . . . ). In a solar cell having such a tandem structure, the p-n junction at the central portion is required to be of a low resistivity (which provides a large leakage current), large band gap energy and thin (which provides a low light absorption loss) layer. Although a micro-crystalline layer is suitable for such a layer, a problem of current loss caused by the recombination centers existing at the boundary of the micro-crystalline layer and the amorphous i layer arises.

From this point of view, each layer of the p and n layer of tandem structure is constituted by an amorphous layer and a micro-crystalline layer, and the amorphous layer is located at the side of the i layer in this embodiment. Such a construction enables attainment of a high efficiency solar cell similar to the first embodiment of FIG. 1.

In FIG. 2, reference numerals 31 and 32 designate i type semiconductor layers, numerals 411 and 421 designate p type amorphous semiconductor layers, and numerals 412 and 422 designate p type micro-crystalline semiconductor layers, such constituting a p layer together with the amorphous layers 411 and 421, respectively. Numerals 413 and 414 together designate an n type micro-crystalline semiconductor layer and an n type amorphous semiconductor layer respectively. Layers 413 and 414 together constitute an n layer.

The present invention is applicable to an n-i-p type amorphous solar cell, and is also applicable to an integrated type structure where the p-i-n or n-i-p structure is subdivided and the upper p (or n) layer and the lowe n (or p) layer are connected by an electrode wiring with each other, with the same effects as described above.

Furthermore, the present invention is applicable to a solar cell where the band gap energy of each i layer of the pin/pin/ . . . /pin structure becomes smaller further from the light incident surface so as the enable utilization of light of various wavelength regions within a range of the sunlight spectrum.

As described above, according to the present invention, each of the p and n layers of the amorphous solar cell is made of a double layer structure comprising an amorphous semiconductor layer and a micro-crystalline semiconductor layer, and the amorphous layer is located at the side of the i layer. Such a construction enables the reduction of the recombination centers at the p-i and n-i junction boundaries to a great extent, and the lowering of the resistivity of the path for passing the electrons and positive holes, resulting in a high output solar cell.

What is claimed is:

1. An amorphous solar cell having a p-i-n or n-i-p structure in which either or both the p and n layers are of a double layer structure, each double layer structure comprising an amorphous semiconductor layer and a micro-crystalline semiconductor layer, wherein both layers of each double layer structure are of the same conductivity type, wherein said amorphous semiconductor layer of each said double layer structure is located at the side of the i layer and wherein said amorphous semiconductor layer in said double layer structure has a thickness in the range of 10 to 50 Å.

2. The amorphous solar cell of claim 1 wherein when said p type layer is of a double layer structure, said micro-crystalline semiconductor layer of the p type double layer structure has a thickness in the range of 20 to 100 Å.

3. The amorphous solar cell of claim 1 wherein said n type layer is of a double layer structure, said micro-crystalline semiconductor layer of the n type layer structure has a thickness in the range of 100 to 500 Å.

4. The amorphous solar cell of claim 1, which includes a plurality of tandemly arranged p-i-n structures, wherein the i layer of the p-i-n structure has an band gap energy which is smaller as the distance from the light incident surface of the solar cell increases.

5. The amorphous solar cell of claim 1, which includes a plurality of tandemly arranged p-i-n or n-i-p structures wherein all of the p and n layers are of a double layer structure.

6. An amorphous solar cell having a p-i-n or n-i-p structure, in which both the p and n layers are of a double layer structure comprising an amorphous semiconductor layer and a micro-crystalline semiconductor layer, wherein both layers of each double layer structure are of the same conductivity type and the amorphous semiconductor layer is located at the side of the i layer,
   wherein said amorphous semiconductor layer in each said double structure has a thickness in the range of 10 to 50 Å.

7. The amorphous solar cell of claim 6 wherein said micro-crystalline semiconductor layer of the p type double layer structure has a thickness in the range of 20 to 100 Å.

8. The amorphous solar cell of claim 6 wherein said micro-crystalline semiconductor layer of the n type layer structure has a thickness in the range of 100 to 500 Å.

* * * * *